US012713838B2

(12) United States Patent
Chang et al.

(10) Patent No.: US 12,713,838 B2
(45) Date of Patent: Aug. 18, 2026

(54) SEMICONDUCTOR LAYOUT PATTERN AND MANUFACTURING METHOD THEREOF

(71) Applicant: UNITED MICROELECTRONICS CORP., Hsin-Chu City (TW)

(72) Inventors: I-Fan Chang, Tainan City (TW); Jia-Rong Wu, Kaohsiung City (TW); Rai-Min Huang, Taipei City (TW); Po-Kai Hsu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 615 days.

(21) Appl. No.: 18/205,570

(22) Filed: Jun. 5, 2023

(65) Prior Publication Data

US 2024/0365679 A1 Oct. 31, 2024

(30) Foreign Application Priority Data

Apr. 28, 2023 (TW) ................................ 112115899

(51) Int. Cl.
*H10N 50/80* (2023.01)
*G11C 11/16* (2006.01)
*H10B 61/00* (2023.01)
*H10N 50/01* (2023.01)

(52) U.S. Cl.
CPC ............ *H10N 50/80* (2023.02); *H10B 61/22* (2023.02); *H10N 50/01* (2023.02); *G11C 11/161* (2013.01)

(58) Field of Classification Search
CPC ................................ H10N 50/80; G11C 5/025
See application file for complete search history.

(56) References Cited

U.S. PATENT DOCUMENTS 7,508,700 B2 3/2009 Zhong
11,011,210 B2 5/2021 Hsu
2012/0153414 A1 * 6/2012 Shuto .................... H10B 61/22
257/E27.07

* cited by examiner

*Primary Examiner* — Shih Tsun A Chou
(74) *Attorney, Agent, or Firm* — Winston Hsu

(57) ABSTRACT

The invention provides a semiconductor layout pattern, which comprises a first metal layer, wherein the first metal layer comprises a plurality of first patterns and a plurality of fishbone line patterns arranged on the same layer, wherein each fishbone line pattern comprises a principal axis pattern extending along a first direction and a plurality of branches arranged along a second direction, and each first pattern is located between two adjacent branches and the principal axis pattern, and a second metal layer is located on the first metal layer. A plurality of magnetic tunnel junction (MTJ) elements located on the second metal layer, wherein each magnetic tunnel junction element is arranged in a rhombic shape.

20 Claims, 5 Drawing Sheets

SEMICONDUCTOR LAYOUT PATTERN AND MANUFACTURING METHOD THEREOF

BACKGROUND OF THE INVENTION

1. Field of the Invention

The invention relates to the field of semiconductors, in particular to a semiconductor layout pattern with magnetic tunnel junction (MTJ) elements arranged in a rhombic shape.

2. Description of the Prior Art

MRAM is a nonvolatile memory technology that uses magnetization to represent stored data. Generally, MRAM includes a plurality of magnetic cells in an array. Each cell typically represents one bit of data. Included in the cells are magnetic elements. A magnetic element may include two ferromagnetic "plates" (or layers upon a semiconductor substrate) each of which has a magnetization direction (or orientation of magnetic moments) associated with it. The two ferromagnetic plates are separated by a thin non-magnetic layer.

More specifically, a MRAM element is often based on a magnetic tunnel junction (MTJ) device. An MTJ element includes at least three basic layers: a "free layer," a tunneling barrier layer, and a "pin layer." The free layer and the pin layer are ferromagnetic layers. The tunneling barrier layer is a thin insulator layer located between the free layer and the pin layer. The magnetization direction of the free layer is free to rotate, but is constrained by the physical size of the layer to point in either of two directions; the magnetization of the pin layer is fixed in a particular direction. A bit is written to the MTJ element by orienting the magnetization direction of the free layer in one of the two directions. Depending upon the orientations of the magnetic moments of the free layer and the pin layer, the resistance of the MTJ element will change. Thus, the bit may be read by determining the resistance of the MTJ element. When the magnetization direction of the free layer and the pin layer are parallel and the magnetic moments have the same polarity, the resistance of the MTJ element is low. Typically, this is designated a "0." When the magnetization direction of the free layer and the pin layer are anti-parallel and the magnetic moments have the opposite polarity, the resistance of the MTJ is high. Typically, this is designated a "1."

SUMMARY OF THE INVENTION

The invention provides a semiconductor layout pattern, which comprises a first metal layer comprising a plurality of first patterns and a plurality of fishbone line patterns arranged on the same layer, wherein each fishbone line pattern comprises a principal axis pattern extending along a first direction and a plurality of branches arranged along a second direction, and each first pattern is located between two adjacent branches and the principal axis pattern, a second metal layer located on the first metal layer, and a plurality of magnetic tunnel junction elements located on the second metal layer, wherein the magnetic tunnel junction elements are arranged in a rhombic shape.

The invention also provides a method for forming semiconductor layout patterns, which comprises the following steps: forming a first metal layer, wherein the first metal layer comprises a plurality of first patterns and a plurality of fishbone line patterns arranged on the same layer, wherein each fishbone line pattern comprises a principal axis pattern extending along a first direction and a plurality of branches arranged along a second direction, and each first pattern is located between two adjacent branches and the principal axis pattern, forming a second metal layer on the first metal layer, and forming a plurality of magnetic tunnel junction elements on the second metal layer, wherein the magnetic tunnel junction elements are arranged in a rhombic shape.

The invention is characterized by providing a semiconductor layout pattern including a plurality of magnetic tunneling junction (MTJ) elements and a manufacturing method thereof. In which a plurality of MTJ elements are arranged in a rhombic shape, so that the advantages of increasing the spacing between elements, reducing the alignment offset, reducing the overall device size and the like can be achieved. In addition, in order to correspond to the rhombic shaped array of the MTJ elements, the invention designs a first metal layer with a special shape, which contains a plurality of first patterns and a plurality of fishbone line patterns. With the special-shaped first metal layer designed by the invention, the subsequently formed MTJ elements can be easily connected to the first metal layer, so that the plurality of MTJ elements can be arranged in a rhombic shape, and the above advantages mentioned above can be achieved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
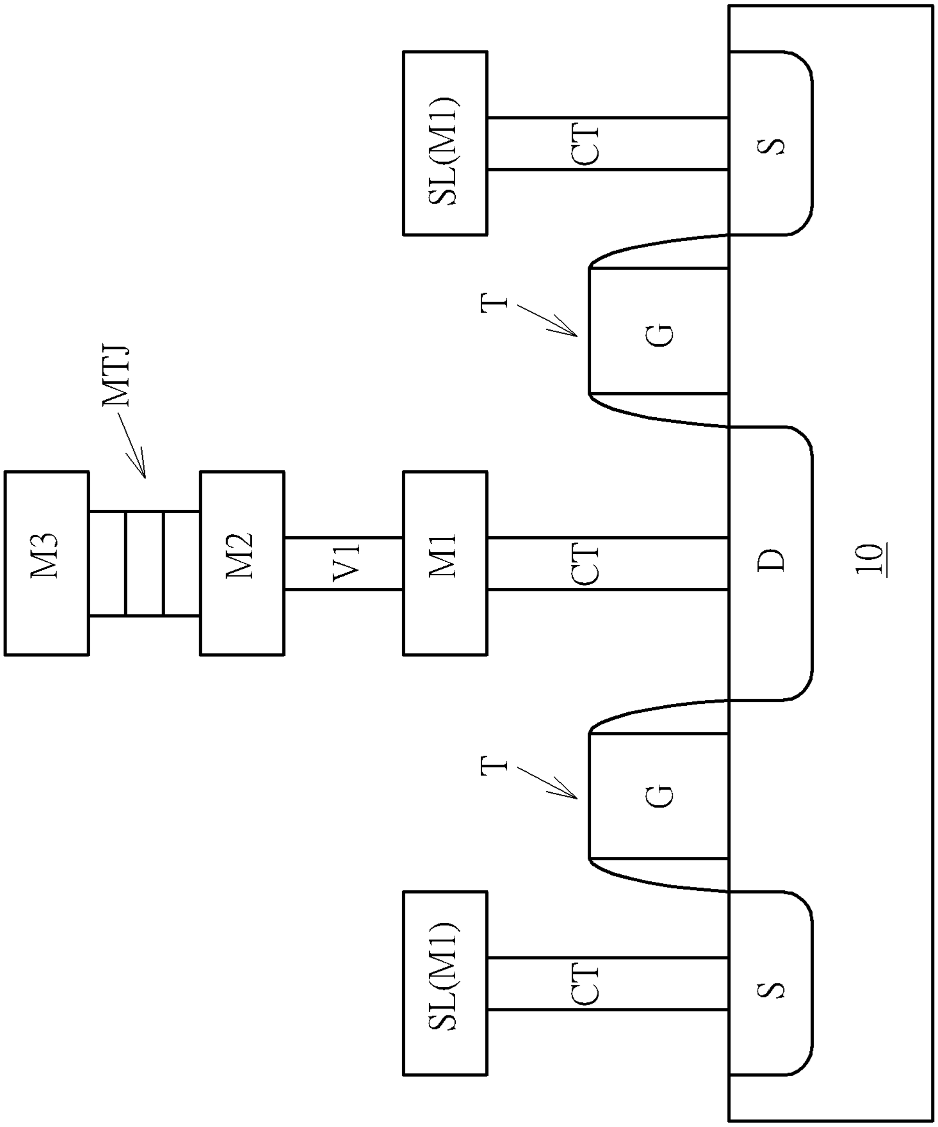
FIG. 1 is a schematic diagram showing the connection relationship between elements of a semiconductor structure of the present invention.

Please refer to FIG. 1, which shows a schematic diagram of the connection relationship between elements of the semiconductor structure of the present invention. First, a substrate 10 includes at least one transistor T, the transistor T includes a gate G, a source S and a drain D. The gate G is located on the surface of the substrate 10, and the source S and the drain D are formed in the substrate 10 and located on both sides of the gate G, wherein the source S and the drain D are formed by ion doping, for example.

In this embodiment, the source S of the transistor T is connected to a select line (SL) through the contact structure CT, and the drain D of the transistor T is connected to the first metal layer M1, the first contact via V1, the second metal layer M2 and the magnetic tunneling junction (MTJ) element (hereinafter referred to simply as the MTJ element) through the contact structure CT. In addition, the MTJ element can be connected with a bit line (BL) later, and the gate G of the transistor T can be connected with a word line (WL), but for the sake of simplicity, the word line and the bit line are not shown in FIG. 1.

In this embodiment, the MTJ element includes a pin layer, an isolation layer and a free layer. The magnetization direction of the free layer can freely rotate and point to one or two directions, and can be switched by using spin-torque transfer (STT). For the pin layer, an antiferromagnetic layer can be used to fix the magnetization direction in a specific direction. The isolation layer is arranged between the free layer and the pin layer. As for the first metal layer M1, the second metal layer M2, the third metal layer M3 or the contact structure CT, the first contact via V1 and other elements, the materials are preferably metals, such as copper and tungsten, but the present invention is not limited to this. The materials and manufacturing methods of the transistor T, the MTJ element or each metal layer or contact structure belong to the prior art in this field, so these technologies are not detailed here.

In the concept of the invention, a plurality of MTJ elements are arranged in a rhombic shape instead of a standard matrix array, so that the spacing between MTJ elements can be increased, the alignment offset can be reduced, and the overall element size can be reduced. The layout pattern arranged in rhombic shape will be further described later. In the present invention, in order to arrange the elements to be MTJ into a rhombic shape, it is necessary to design the first metal layer M1 with a special shape to correspond to the positions of each MTJ element.

Figure 2:
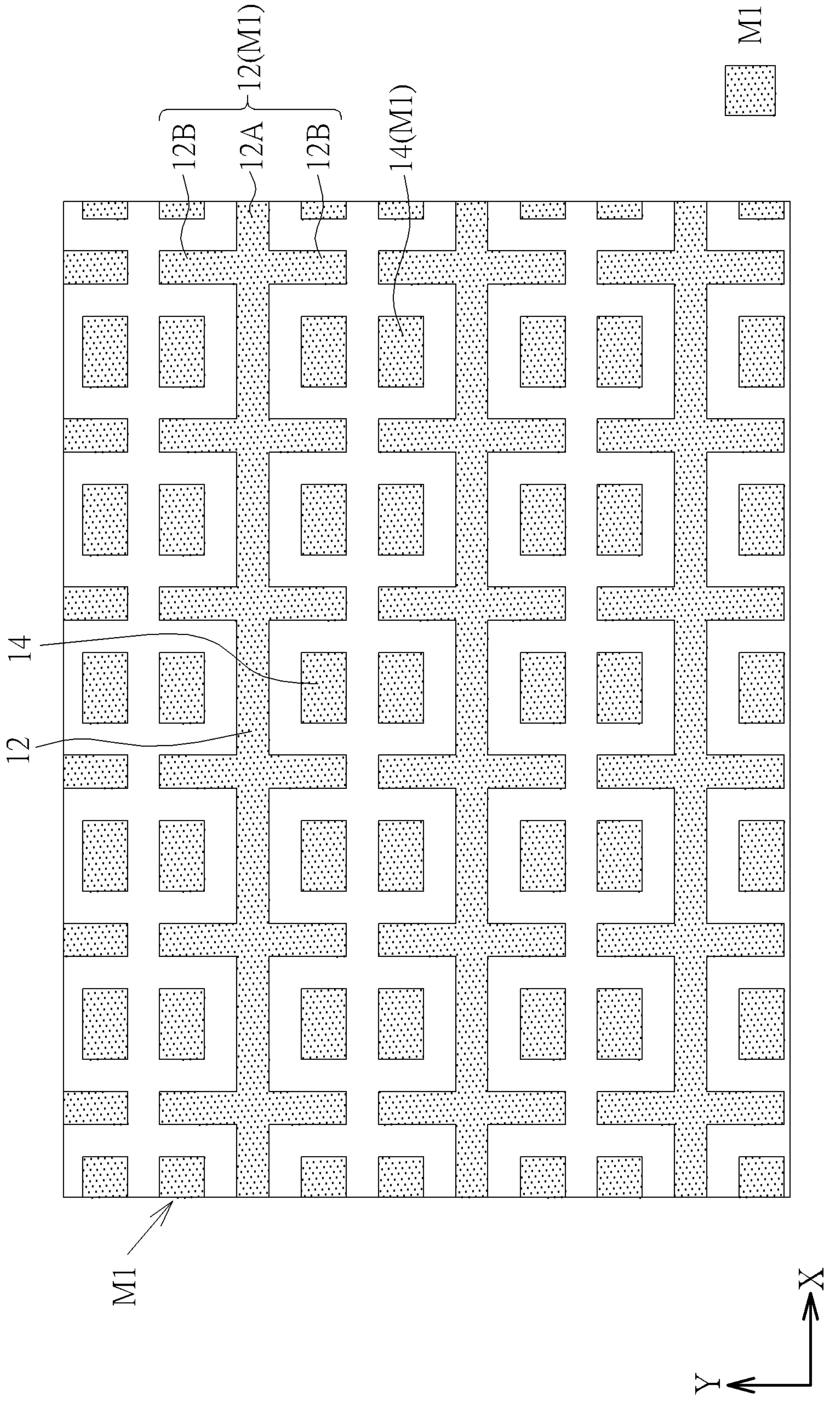
FIG. 2 shows a top view of a first metal layer in a semiconductor layout of the present invention.

FIG. 2 shows a top view of a first metal layer in a semiconductor layout of the present invention. In FIG. 2, a first metal layer M1 is formed, the first metal layer M1 of the present invention has a special shape. Specifically, the first metal layer M1 includes a plurality of fishbone line patterns 12 and a plurality of first patterns 14, each fishbone line pattern 12 includes a principal axis pattern 12A and a plurality of branches 12B, the principal axis pattern 12A is arranged along a first direction (e.g., X axis), while the branches 12B are arranged along a second direction (e.g., Y axis), and the branches 12B are located at two sides (e.g., upper and lower sides) of the principal axis pattern 12A and arranged at equal intervals. Further, the branches 12B located on the upper and lower sides of the principal axis pattern 12A are aligned in the second direction. Therefore, part of the principal axis pattern 12A and two adjacent branches 12B together form a U-shaped opening. The first patterns 14 are preferably rectangular patterns, which are located in the U-shaped opening formed by the principal axis pattern 12A and two adjacent branches 12B, that is, each first pattern 14 is located between two adjacent branches 12B and the principal axis pattern 12A. In addition, in other embodiments of the present invention, the first pattern 14 may also be an oval pattern.

In this embodiment, the fishbone line pattern 12 and the first pattern 14 are located in the same layer, and both belong to the first metal layer M1. In this embodiment, the first metal layer M1 with a special shape is designed, which is helpful to form the subsequent MTJ elements arranged in a rhombic shape.

In this embodiment, please refer to both FIG. 1 and FIG. 2. The principal axis pattern 12A of the fishbone line pattern 12 is electrically connected to the selection line SL, and the branch 12B of the fishbone line pattern 12 is electrically connected to the source S of the transistor T, that is, the source S of the transistor T can be connected to the selection line SL through the fishbone line pattern 12. In addition, the first pattern 14 is electrically connected to the drain D of the transistor T.

Figure 3:
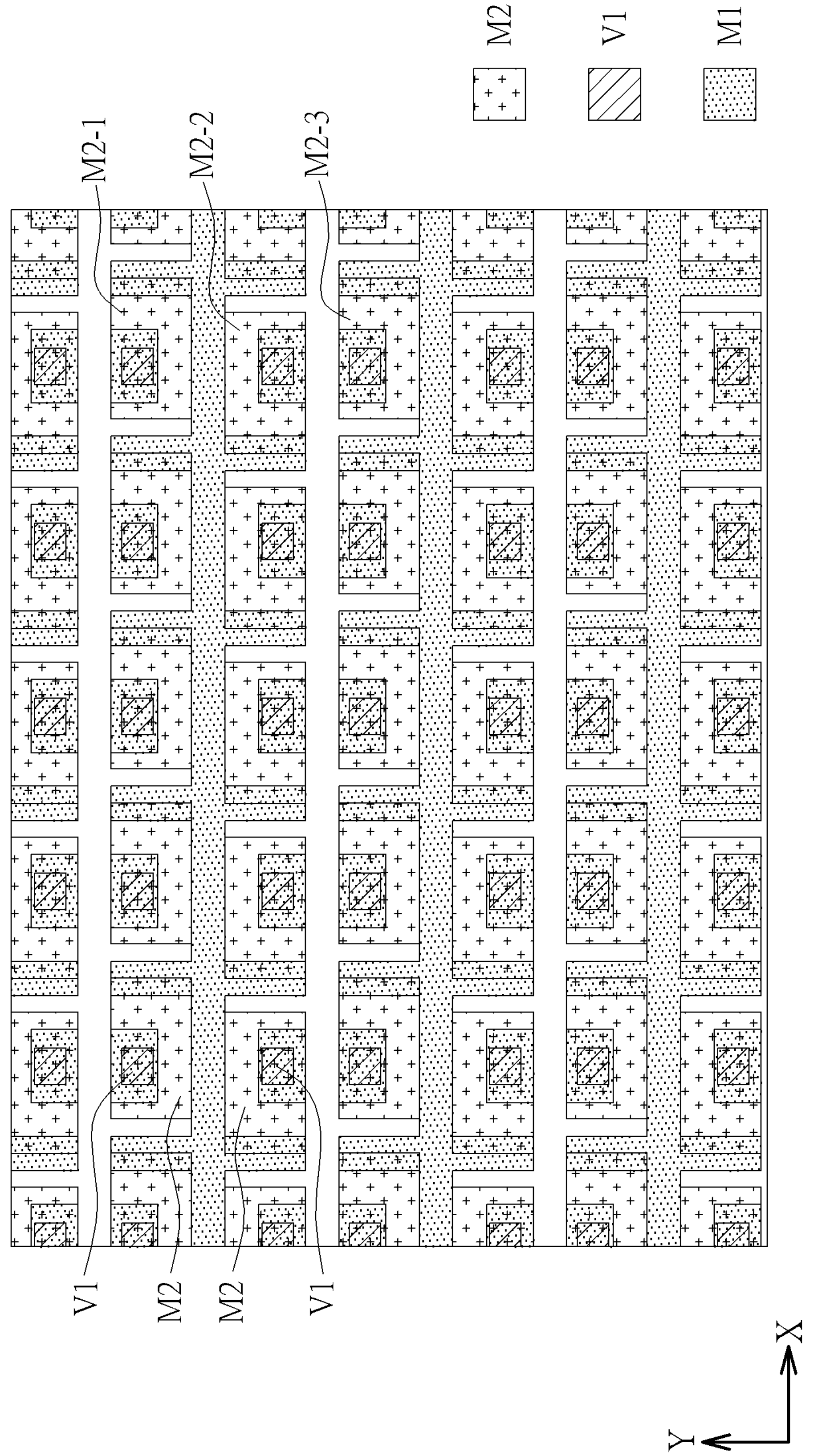
FIG. 3 shows a top view of the first metal layer, the first contact and the second metal layer in the semiconductor layout of the present invention.

Please refer to FIG. 3, which shows the top view of the first metal layer, the first contact and the second metal layer in the semiconductor layout of the present invention. After the first metal layer M1 is formed, a first contact via V1 and a second metal layer M2 are subsequently formed, wherein the first contact via V1 is connected with the first pattern 14 in the first metal layer M1, and the second metal layer M2 contains a plurality of rectangular patterns arranged in an array, and each rectangular pattern is electrically connected with the first contact via V1 and the first pattern 14 below.

In addition, in this embodiment, the second metal layer M2 is not arranged in a matrix. Specifically, for any fishbone line pattern 12, there is an offset between the second metal layer M2 located above and below the fishbone line pattern 12 in the second direction (Y direction). For example, in FIG. 3, three second metal layers are marked, which are defined as second metal layer M2-1, second metal layer M2-2 and second metal layer M2-3 respectively, wherein the second metal layer M2-1 and second metal layer M2-2 are located above and below a fishbone line pattern 12 respectively, and there is an offset between them in the Y direction. However, the second metal layer M2-1 and the second metal layer M2-3 are aligned in the Y direction.

Figure 4:
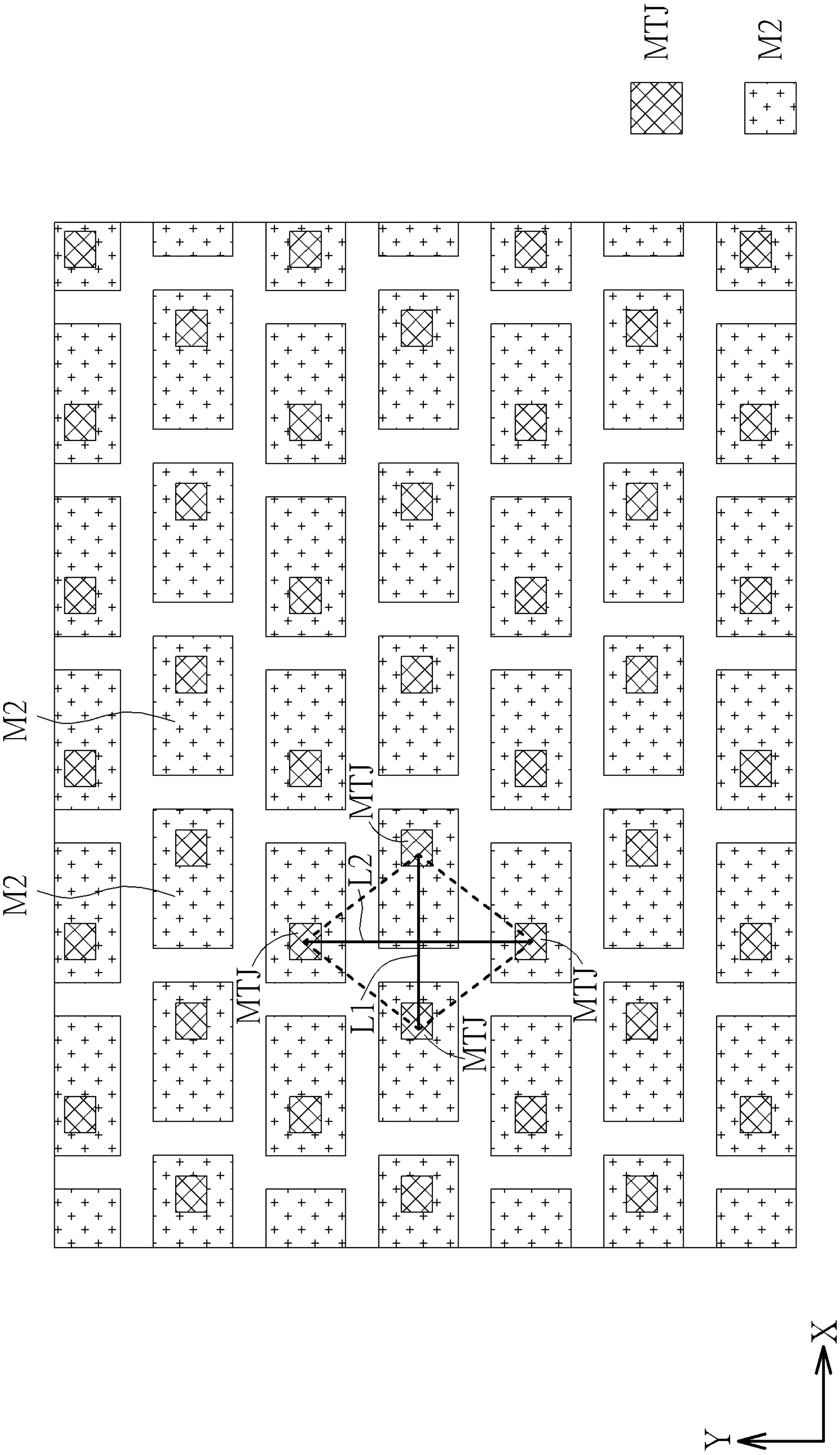
FIG. 4 shows a top view of the second metal layer and the MTJ element in the semiconductor layout of the present invention.

Please refer to FIG. 4, which shows the top view of the second metal layer and the MTJ elements in the semiconductor layout of the present invention. Then, a plurality of MTJ elements are formed on the second metal layer M2, the plurality of MTJ elements are arranged in a rhombic shape. The rhombic shape defined in this embodiment means that any four adjacent MTJ elements can be arranged in a rhombic shape (for example, the rhombic shape depicted in FIG. 4), and two of these four MTJ elements are aligned in the first direction and the other two of these four MTJ elements are aligned in the second direction. An extension line between the two MTJ elements aligned in the first direction (extension line L1 in FIG. 4) and an extension line between the two MTJ elements aligned in the second direction (extension line L2 in FIG. 4) intersect and are perpendicular to each other. The rest of the definitions of rhombic shape not detailed in the present invention are the same as those of rhombic shape in the prior art.

Please refer to FIG. 2 to FIG. 4 together. Because the first metal layer M1 is designed in a special shape, after the second metal layer M2 is formed, each second metal layer M2 has a relatively larger area. Thus, for example, the formation position of subsequent MTJ elements can be adjusted, so that each MTJ element can be formed on each second metal layer M2, and can be arranged in a rhombic shape. Moreover, in the invention, the MTJ elements are arranged in a rhombic shape, so that the spacing between the MTJ elements can be increased compared with the standard rectangular array arrangement, but at the same time, the fault tolerance rate of element alignment can be improved (that is, the offset probability can be reduced), and the area of the overall element can be reduced.

Figure 5:
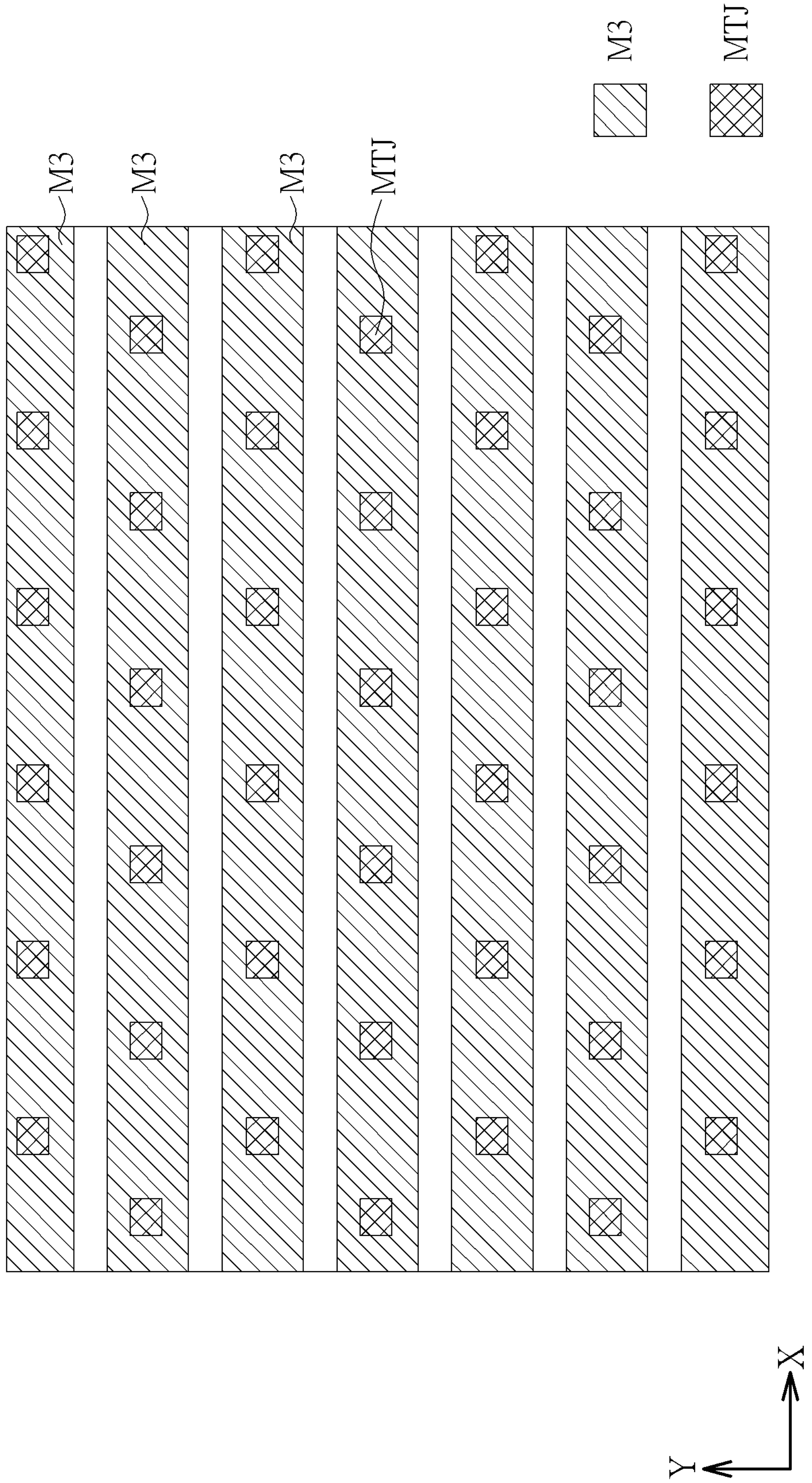
FIG. 5 shows a top view of the MTJ elements and the third metal layer in the semiconductor layout of the present invention.

Please refer to FIG. 5, which shows the top view of the MTJ element and the third metal layer in the semiconductor layout of the present invention. Subsequently, the third metal layer M3 is continuously formed, and the third metal layer M3 is connected to the MTJ elements and then connected to the bit line (not shown). The layout pattern of the third metal layer M3 shown in this embodiment is only one example, and the present invention is not limited to this.

Based on the above description and drawings, the present invention provides a semiconductor layout pattern, which comprises a first metal layer M1, wherein the first metal layer M1 comprises a plurality of first patterns 14 and a plurality of fishbone line patterns 12 arranged on the same layer, wherein each fishbone line pattern 12 comprises a principal axis pattern 12A extending along a first direction (X axis) and a plurality of branches 12B arranged along a second direction (Y axis). Each first pattern 14 is located between two adjacent branches 12B and the principal axis 12A, a second metal layer M2 is located on the first metal layer M1, and a plurality of magnetic tunnel junctions (MTJ) elements are located on the second metal layer M2, wherein the magnetic tunnel junctions are arranged in a rhombic shape.

The invention further provides a method for forming semiconductor layout patterns, which comprises forming a first metal layer M1, wherein the first metal layer M1 comprises a plurality of first patterns 14 and a plurality of fishbone line patterns 12 arranged on the same layer, wherein each fishbone line pattern 12 comprises a principal axis pattern 12A extending along a first direction (X axis) and a plurality of branches 12B arranged along a second direction (Y axis), and each first pattern 14 is located between two adjacent branches 12B and the principal axis pattern 12A. Afterwards, a second metal layer M2 is formed and located on the first metal layer M1, and a plurality of magnetic tunnel junction (MTJ) elements are formed and located on the second metal layer M2, wherein each magnetic tunnel junction element is arranged in a rhombic shape.

In some embodiments of the present invention, a plurality of branches 12B are arranged at equal intervals on both sides of the principal axis pattern 12A.

In some embodiments of the present invention, any two adjacent branches 12B and part of the principal axis pattern 12A define a U-shaped opening, and the first pattern 14 is located in the U-shaped opening.

In some embodiments of the present invention, the first pattern 14 comprises a rectangle shape pattern or an ellipse shape pattern.

In some embodiments of the present invention, the first pattern 14 is electrically connected to the second metal layer M2, and each second metal layer M2 is electrically connected to one of the magnetic tunneling junction elements.

In some embodiments of the present invention, the fishbone line pattern 12 is electrically connected to a selection line SL.

In some embodiments of the present invention, the magnetic tunneling junction elements are arranged in a rhombic shape, wherein any four adjacent magnetic tunneling junction elements can be arranged in a rhombic shape, and other magnetic tunneling junction elements are not included between the four adjacent magnetic tunneling junction elements, and two of the four adjacent magnetic tunneling junction elements are aligned in the first direction and the other two are aligned in the second direction.

In some embodiments of the present invention, the first direction (X axis) and the second direction (Y axis) are perpendicular to each other.

In some embodiments of the present invention, the second metal layer M2 includes a plurality of second patterns (the rectangular patterns in FIG. 4), and each magnetic tunneling junction element is located on one of the second patterns.

In some embodiments of the present invention, a transistor T is located under the first metal layer M1, and the transistor comprises a gate G, a source S and a drain D, wherein the fishbone line pattern 12 is electrically connected to a source S of the transistor T, and the first pattern 14 is electrically connected to a drain D of the transistor T.

The invention is characterized by providing a semiconductor layout pattern including a plurality of magnetic tunneling junction (MTJ) elements and a manufacturing method thereof. In which a plurality of MTJ elements are arranged in a rhombic shape, so that the advantages of increasing the spacing between elements, reducing the alignment offset, reducing the overall device size and the like can be achieved. In addition, in order to correspond to the rhombic shaped array of the MTJ elements, the invention designs a first metal layer with a special shape, which contains a plurality of first patterns and a plurality of fishbone line patterns. With the special-shaped first metal layer designed by the invention, the subsequently formed MTJ elements can be easily connected to the first metal layer, so that the plurality of MTJ elements can be arranged in a rhombic shape, and the above advantages mentioned above can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor layout pattern comprising:

a first metal layer comprising a plurality of first patterns and a plurality of fishbone line patterns, wherein each of the plurality of fishbone line patterns comprises a principal axis pattern extending along a first direction and a plurality of branches arranged along a second direction, and each of the plurality of first patterns is located between two adjacent branches of the plurality of branches and the principal axis pattern;

a second metal layer located on the first metal layer; and a plurality of magnetic tunnel junction elements located on the second metal layer, wherein the magnetic tunnel junction elements are arranged in a rhombic shape.

2. The semiconductor layout pattern according to claim 1, wherein the plurality of branches are arranged on both sides of the principal axis pattern at equal intervals.

3. The semiconductor layout pattern according to claim 2, wherein any two adjacent branches of the plurality of branches and part of the principal axis pattern define an U-shaped opening, and each of the plurality of first patterns is located in a corresponding U-shaped opening.

4. The semiconductor layout pattern according to claim 1, wherein each of the plurality of first patterns comprises a rectangular pattern or an elliptical pattern.

5. The semiconductor layout pattern according to claim 1, wherein each of the plurality of first patterns is electrically connected to the second metal layer, and the second metal layer is electrically connected to one of the magnetic tunneling junction elements.

6. The semiconductor layout pattern according to claim 1, wherein each of the plurality of fishbone line patterns is electrically connected to a selection line.

7. The semiconductor layout pattern according to claim 1, wherein the plurality of magnetic tunnel junction elements are arranged in the rhombic shape, wherein:

any four adjacent magnetic tunneling junction elements of the plurality of magnetic tunnel junction elements can be arranged in the rhombic shape, wherein no other magnetic tunneling junction elements are included between the four adjacent magnetic tunneling junction elements;

two of the four adjacent magnetic tunneling junction elements are aligned in the first direction, and the other two of the four adjacent magnetic tunneling junction elements are aligned in the second direction.

8. The semiconductor layout pattern according to claim 1, wherein the first direction and the second direction are perpendicular to each other.

9. The semiconductor layout pattern according to claim 1, wherein the second metal layer comprises a plurality of second patterns, and each magnetic tunneling junction element is located on one of the second patterns.

10. The semiconductor layout pattern according to claim 1, further comprising a transistor disposed under the first metal layer, wherein the transistor comprises a gate, a source and a drain, and wherein one of the plurality of fishbone line patterns is electrically connected to the source of the transistor, and one of the plurality of first patterns is electrically connected to the drain of the transistor.

11. A method for forming a semiconductor layout pattern, comprising:

forming a first metal layer comprising a plurality of first patterns and a plurality of fishbone line patterns, wherein each of the plurality of fishbone line patterns comprises a principal axis pattern extending along a first direction and a plurality of branches arranged along a second direction, and each of the plurality of first patterns is located between two adjacent branches of the plurality of branches and the principal axis pattern;

forming a second metal layer on the first metal layer; and forming a plurality of magnetic tunnel junction elements on the second metal layer, wherein the magnetic tunnel junction elements are arranged in a rhombic shape.

12. The method for forming a semiconductor layout pattern according to claim 11, wherein the plurality of branches are arranged on both sides of the principal axis pattern at equal intervals.

13. The method for forming a semiconductor layout pattern according to claim 12, wherein any two adjacent branches of the plurality of branches and part of the principal axis pattern define an U-shaped opening, and each of the plurality of first patterns is located in a corresponding U-shaped opening.

14. The method for forming a semiconductor layout pattern according to claim 11, wherein each of the plurality of first patterns comprises a rectangular pattern or an elliptical pattern.

15. The method for forming a semiconductor layout pattern according to claim 11, wherein each of the plurality of first patterns is electrically connected to the second metal layer, and the second metal layer is electrically connected to one of the magnetic tunneling junction elements.

16. The method for forming a semiconductor layout pattern according to claim 11, wherein each of the plurality of fishbone line patterns is electrically connected to a selection line.

17. The method for forming a semiconductor layout pattern according to claim 11, wherein the plurality of magnetic tunnel junction elements are arranged in the rhombic shape, wherein:

any four adjacent magnetic tunneling junction elements of the plurality of magnetic tunnel junction elements can be arranged in the rhombic shape, wherein no other magnetic tunneling junction elements are included between the four adjacent magnetic tunneling junction elements;

two of the four adjacent magnetic tunneling junction elements are aligned in the first direction, and the other two of the four adjacent magnetic tunneling junction elements are aligned in the second direction.

18. The method for forming a semiconductor layout pattern according to claim 11, wherein the first direction and the second direction are perpendicular to each other.

19. The method for forming a semiconductor layout pattern according to claim 11, wherein the second metal layer comprises a plurality of second patterns, and each magnetic tunneling junction element is located on one of the second patterns.

20. The method for forming a semiconductor layout pattern according to claim 11, further comprising a transistor disposed under the first metal layer, wherein the transistor comprises a gate, a source and a drain, and wherein one of the plurality of fishbone line patterns is electrically connected to the source of the transistor, and one of the plurality of first patterns is electrically connected to the drain of the transistor.

* * * * *